United States Patent
Ma et al.

(10) Patent No.: US 12,211,762 B2
(45) Date of Patent: Jan. 28, 2025

(54) SEMICONDUCTOR DEVICES AND METHODS OF MANUFACTURING SEMICONDUCTOR DEVICES

(71) Applicant: Amkor Technology Singapore Holding Pte. Ltd., Valley Point #12-03 (SG)

(72) Inventors: Sang Yun Ma, Incheon (KR); Dong Hee Kang, Gyenoggi-do (KR); Sang Hyoun Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 101 days.

(21) Appl. No.: 17/473,834

(22) Filed: Sep. 13, 2021

(65) Prior Publication Data
US 2023/0078862 A1    Mar. 16, 2023

(51) Int. Cl.
*H01L 23/055* (2006.01)
*H01L 23/10* (2006.01)
*H01L 23/42* (2006.01)
*H01L 23/498* (2006.01)

(52) U.S. Cl.
CPC ............ *H01L 23/055* (2013.01); *H01L 23/10* (2013.01); *H01L 23/42* (2013.01); *H01L 23/49833* (2013.01)

(58) Field of Classification Search
None
See application file for complete search history.

(56) References Cited

U.S. PATENT DOCUMENTS

| | | | |
|---|---|---|---|
| 5,587,882 A * | 12/1996 | Patel | H01L 25/0655 257/713 |
| 10,109,591 B1 | 10/2018 | Mescher et al. | |
| 2004/0036162 A1* | 2/2004 | Chuang | H01L 23/4006 257/E23.102 |
| 2009/0302436 A1* | 12/2009 | Kim | H01L 23/29 257/659 |
| 2016/0013173 A1* | 1/2016 | Vadhavkar | H01L 23/3675 438/109 |
| 2017/0372979 A1* | 12/2017 | Gandhi | H01L 23/3675 |
| 2018/0012865 A1* | 1/2018 | Schrock | H01L 23/3675 |
| 2021/0193538 A1* | 6/2021 | Huang | H01L 23/04 |

* cited by examiner

*Primary Examiner* — Erik T. K. Peterson
*Assistant Examiner* — Christopher A. Schodde
(74) *Attorney, Agent, or Firm* — Kevin B. Jackson

(57) ABSTRACT

In one example, a semiconductor device includes a first substrate with a first substrate top side, a first substrate bottom side opposite to the first substrate top side, a first substrate lateral side interposed between the first substrate top side and the first substrate bottom side, and a first substrate conductive structure. An electronic component is coupled to the first substrate top side and coupled to the first substrate conductive structure. A support includes a support wall having a first ledge coupled to the first substrate top side, a first riser coupled to the first substrate lateral side, and a second ledge extending from the first riser away from the first substrate lateral side. Other examples and related methods are also disclosed herein.

17 Claims, 8 Drawing Sheets

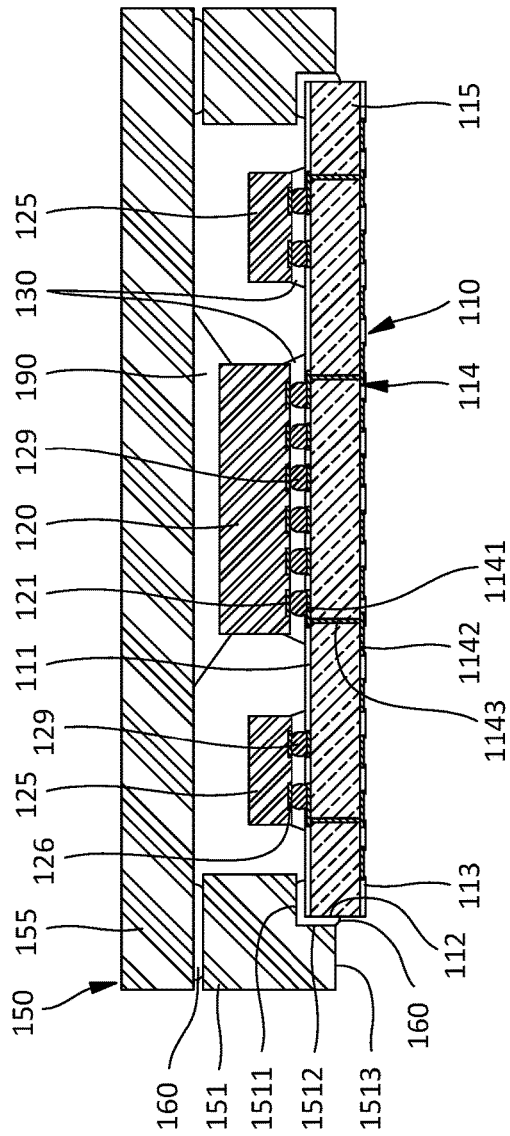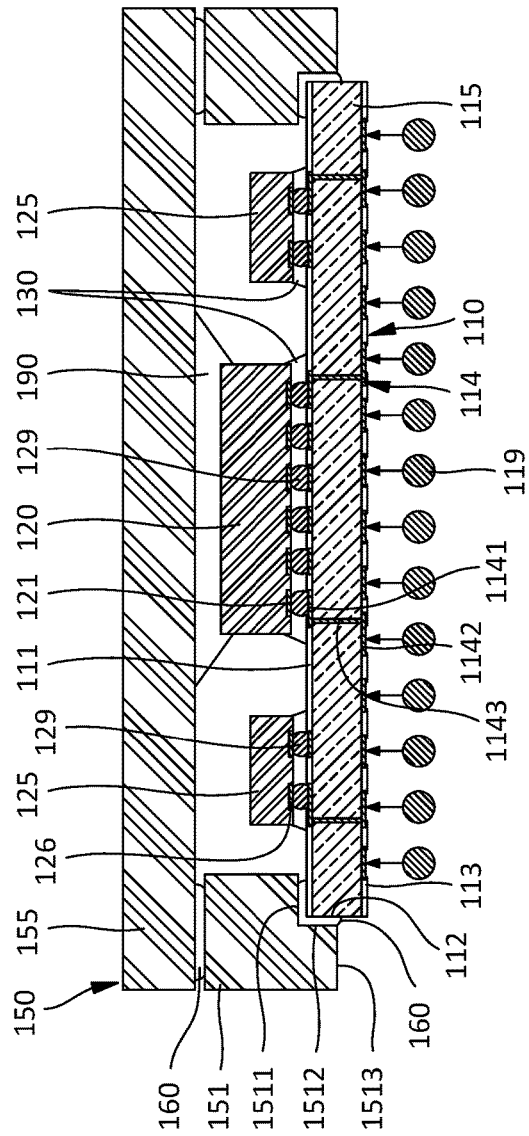

SEMICONDUCTOR DEVICES AND METHODS OF MANUFACTURING SEMICONDUCTOR DEVICES

CROSS-REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, and 2D show cross-sectional views of an example method for manufacturing an example semiconductor device.

Figure 1:
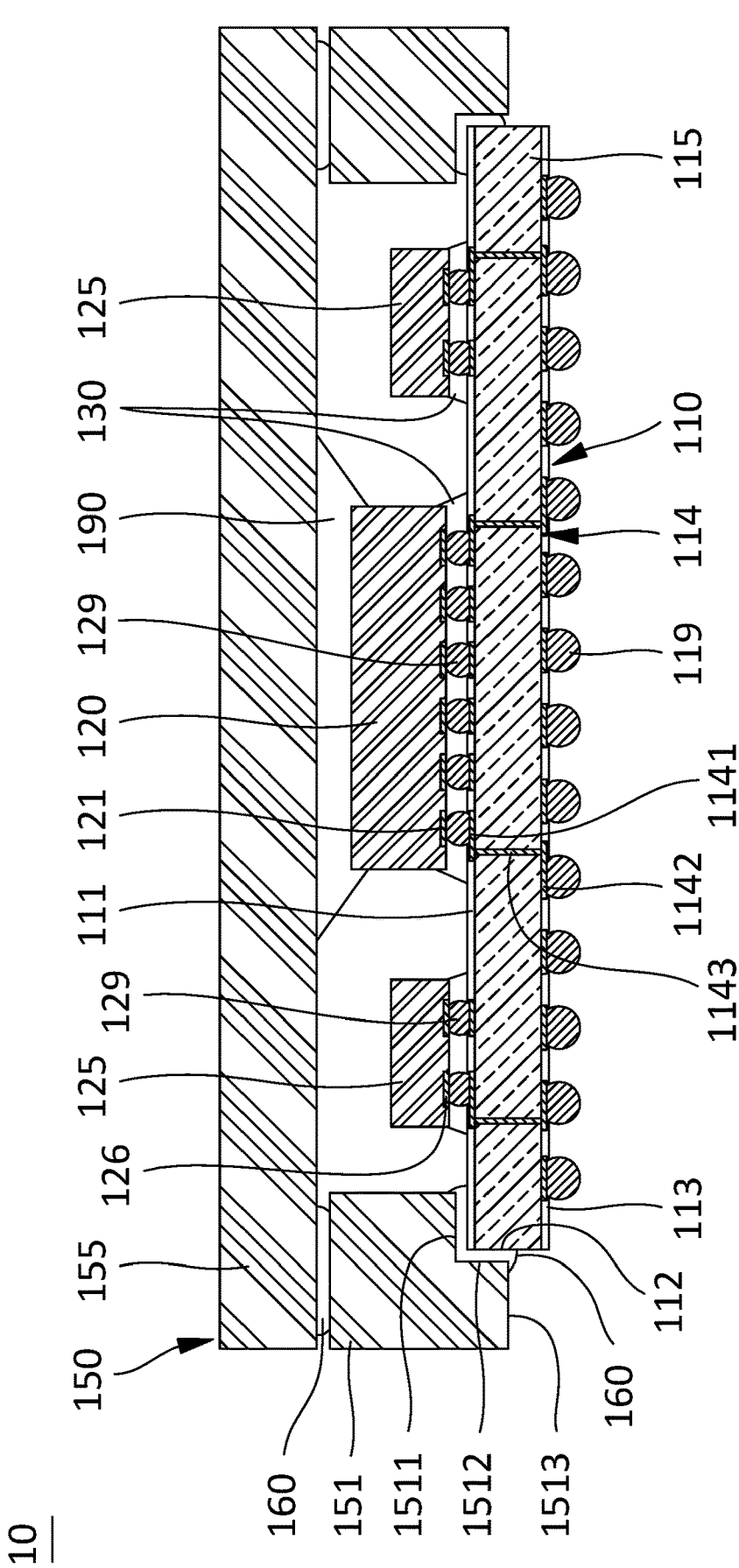
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

The present description includes, among other features, devices and associated methods that relate to semiconductor packaging. In some examples, 3D stiffener or lid configurations are described that have improved adhesion strength and narrower footprints. The devices and methods provide, among other things, improved warpage control, which improves semiconductor package reliability.

In an example, a semiconductor device includes a first substrate with a first substrate top side, a first substrate bottom side opposite to the first substrate top side, a first substrate lateral side interposed between the first substrate top side and the first substrate bottom side, and a first substrate conductive structure. An electronic component is coupled to the first substrate top side and coupled to the first substrate conductive structure. A support includes a support wall having a first ledge coupled to the first substrate top side, a first riser coupled to the first substrate lateral side, and a second ledge extending from the first riser away from the first substrate lateral side.

In an example, a semiconductor device includes a substrate having a substrate top side, a substrate bottom side opposite to the substrate top side, a substrate lateral side interposed between the substrate top side and the substrate bottom side, and a substrate conductive structure. An electronic component is coupled to the substrate conductive structure adjacent to the substrate top side. A support includes a support wall having a first ledge coupled to the substrate top side, a first riser coupled to the substrate lateral side, and a second ledge extending from the riser away from the substrate lateral side; and a support roof coupled to the support wall and overlapping the electronic component.

In an example, a method of manufacturing a semiconductor device, includes providing a substrate having a substrate top side, a substrate bottom side opposite to the substrate top side, a substrate lateral side interposed between the substrate top side and the substrate bottom side, and a substrate conductive structure. The method includes coupling an electronic component to the substrate conductive structure at the substrate top side. The method includes providing a support having a support wall including a first ledge, a first riser, and a second ledge; and a support roof. The method includes coupling the support to substrate so that the first ledge is coupled to the substrate top side, the first riser is coupled to the substrate lateral side, the second ledge extends extending from the first riser away from the substrate lateral side, and the support roof is coupled to the support wall and overlapping the electronic component.

Other examples are included in the present disclosure. Such examples may be found in the figures, in the claims, and/or in the description of the present disclosure.

FIG. 1 shows a cross-sectional view of an example semiconductor device 10. In the example shown in FIG. 1, semiconductor device 10 can comprise substrate 110, substrate interconnects 119, electronic component 120, electronic component 125, component interconnect 129, underfill 130, coupler film 190, support 150 and adhesive 160.

Substrate 110 can comprise substrate top side 111, substrate lateral side 112 and substrate bottom side 113. Substrate 110 can further comprise conductive structure 114 and body structure 115. Conductive structure 114 can comprise top interconnect 1141, bottom interconnect 1142, and conductive path 1143.

Electronic component 120 can comprise component terminals 121. Electronic component 125 can comprise component terminals 126. Support 150 can comprise support wall 151 and support roof 155. Support wall 151 can comprise first ledge 1511, first riser 1512 and second ledge 1513.

Substrate 110 and support 150 can be referred to as a semiconductor package and package can provide protection for electronic components 120 or 125 from external elements and/or environmental exposure. The semiconductor package can provide electrical coupling between external electrical components and electrical components 120, 125 through substrate interconnects 119.

FIGS. 2A, 2B, 2C, and 2D show cross-sectional views of an example method for manufacturing semiconductor device 10.

Figure 2A:
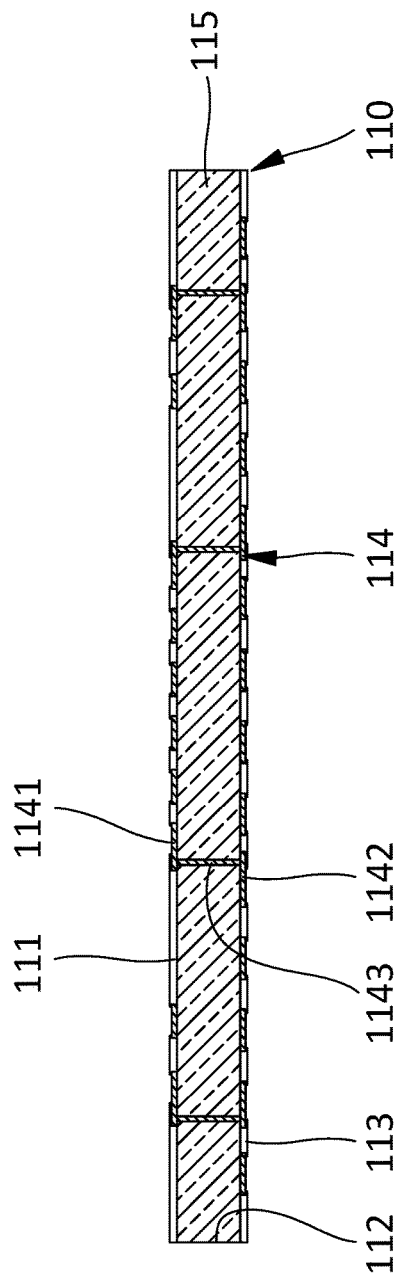

FIG. 2A shows a cross-sectional view of semiconductor device 10 at an early stage of manufacture. In the example shown in FIG. 2A, substrate 110 can be provided. In some examples, substrate 110 can comprise a substantially flat substrate top side 111, a substantially flat substrate bottom side 113 which is opposite to substrate top side 111, and a substrate lateral side 112 interposed between substrate top side 111 and substrate bottom side 113. In some examples, substrate 110 can comprise or be referred to as a package substrate, a printed circuit board, a laminate substrate, a redistribution layer (RDL) substrate, a semiconductor substrate, a glass substrate, or a ceramic substrate. In some examples, substrate 110 can comprise or be referred to as a passive substrate or an active substrate (e.g., having transistors or other active circuitry). In some examples, substrate 110 can comprise conductive structure 114 and body structure 115. Conductive structure 114 can comprise one or more conductive layers defining signal distribution paths or elements such as traces, vias, through silicon vias (TSVs), through glass vias (TGVs), or pads. In some examples, conductive structure 114 can comprise copper, aluminum, nickel, palladium, gold, or silver. Conductive structure 114 can comprise top interconnect 1141 provided at substrate top side 111 of body structure 115, bottom interconnect 1142 provided at substrate bottom side 113 of body structure 115, and conductive path 1143 traversing through body structure 115 to couple top interconnect 1141 and bottom interconnect 1142. Conductive path 1143 can comprise one or more elements, such as pads, vias, or traces, coupled together. In some examples, body structure 115 can comprise one or more dielectric or semiconductor layers through which conductive structure 114 extends. The thickness of substrate 110 can be approximately 0.1 mm (millimeter) to 1000 mm. Substrate 110 can support electronic components 120 or 125 and can couple electronic components 120 or 125 to external electrical components.

In some examples, substrate 110 can be a pre-formed substrate. The pre-formed substrate can be manufactured prior to attachment to an electronic component and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, substrate 110 can be a redistribution layer ("RDL") substrate. RDL substrates can comprise one or more conductive redistribution layers and one or more dielectric layers that (a) can be formed layer by layer over an electronic component to which the RDL substrate is to be coupled, or (b) can be formed layer by layer over a carrier that can be entirely removed or at least partially removed after the electronic component and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic component, and/or (b) fan-in electrical traces within the footprint of the electronic component. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

Figure 2B:
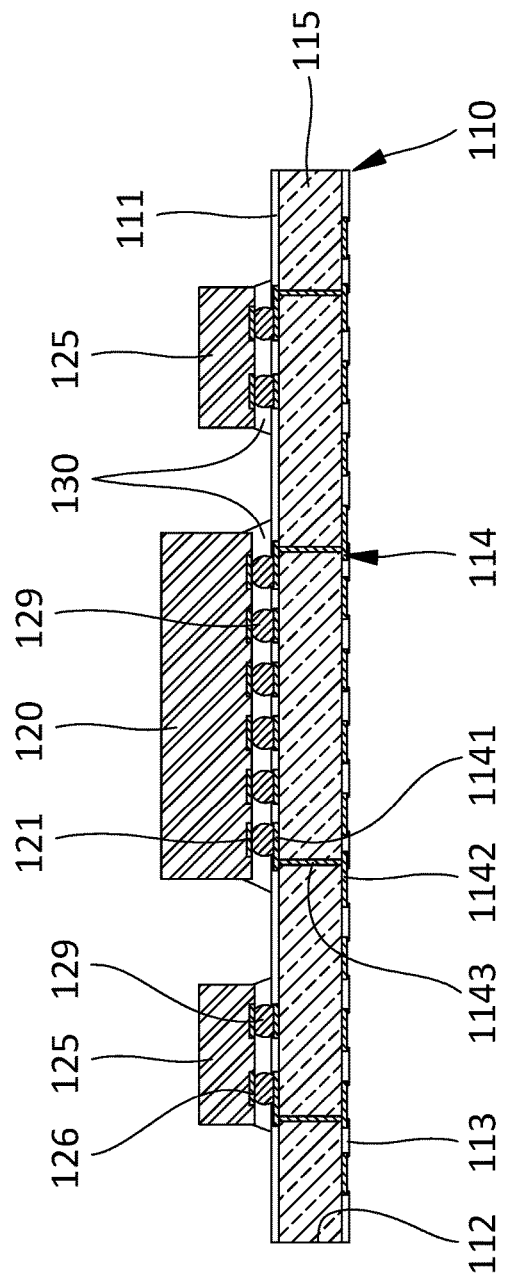

FIG. 2B shows a cross-sectional view of semiconductor device 10 at a later stage of manufacture. In the example shown in FIG. 2B, one or more electronic components 120 or 125 can be coupled with top interconnects 1141 of substrate 110. In some examples, electronic component 120 can comprise or be referred to as a semiconductor die, a semiconductor chip, or a semiconductor package. A die or chip can comprise an integrated circuit die separated from a semiconductor wafer. In some examples, electronic component 120 can comprise digital signal processors (DSPs), network processors, power management units, audio processors, RF circuits, wireless baseband system on chip (SoC) processors, sensors, and application specific integrated circuits. In some examples, one or more electronic component 125 can optionally be coupled to top interconnects 1141 of substrate 110. In some examples, electronic component 125 can comprise an active component or active circuitry. In some examples, electronic component 125 can comprise a passive component, such as capacitors, inductors diodes, etc. In some examples, electronic components 120, 125 can comprise a sensor, an optical emitter or receiver, an RF emitter or receiver, an antenna element, or other electronic components as known to one of ordinary skill in the art. In some examples, the thickness of electronic components 120 or 125 can be about 20 μm (micrometer) to about 2000 μm. In some examples, electronic components 120 or 125 can perform calculation and control processing, store data, or remove noise from an electrical signal.

In some examples, electronic component 120 can comprise component terminals 121, and electronic component 125 can comprise component terminals 126. Component terminals 121 and 126 can be coupled to top interconnects 1141 of substrate 110 by way of component interconnects 129. Component interconnect 129 can comprise or be referred to as pads, pillars, posts, or bumps. In some examples, component interconnect 129 can be coupled directly to top interconnect 1141, or component interconnect 129 can be coupled to top interconnect 1141 through a bonding material such as solder. In some examples, electronic components 120 or 125 can be coupled to top interconnect 1141 by a mass reflow process, a thermal compression process, or a laser assisted bonding process. In some examples, the thickness of component interconnect 129 can be between approximately 1 μm and approximately 2000 μm. Component interconnects 129 can mechanically and electrically couple electronic components 120 and 125 to substrate 110.

In some examples, underfill 130 can be further provided between substrate 110 and electronic components 120 or 125. In some examples, underfill 130 can be inserted into a gap between electronic components 120 or 125 and substrate 110 after electronic components 120 or 125 are coupled with substrate 110. In some examples, underfill 130 can be applied on substrate 110 in advance before electronic components 120 or 125 are coupled to substrate 110. Accordingly, while electronic components 120 or 125 press underfill 130, component interconnects 129 can pass through underfill 130 to be coupled to substrate 110. In some examples, a curing process of underfill 130 can be further performed.

FIG. 2C shows a cross-sectional view of semiconductor device 10 at a later stage of manufacture. In the example shown in FIG. 2C, support 150 can be provided on substrate 110. In some examples, support 150 can cover electronic components 120 or 125. Support 150 can be attached to substrate lateral side 112 as well as substrate top side 111 of substrate 110. Support 150 can comprise or be referred to as a stiffener, lid, heat sink, heat spreader, or electromagnetic (EMI) shield. In some examples, support 150 can comprise metal, ceramic, resin, or laminate materials. In some examples, support 150 can comprise copper, nickel-plated copper, nickel, aluminum, or stainless steel. In some examples, support 150 can be manufactured in a variety of ways, such as by etching, stamping, or pressing a metal plate.

In some examples, support 150 can comprise support wall 151 bonded to substrate top side 111 and substrate lateral side 112 of substrate 110 through adhesive 160. Support wall 151 can comprise first ledge 1511 attached to substrate top side 111, first riser 1512 attached to substrate lateral side 112, and second ledge 1513 extending from first riser 1512 away from substrate lateral side 112. A surface of first ledge 1511 can be substantially parallel to substrate top side 111. First riser 1512 can be substantially parallel to substrate lateral side 112. Second ledge 1513 can be substantially parallel to substrate top side 111 and/or substrate bottom side 113. In some examples, the top of support wall 151 can be lower, substantially equal to, or higher than the top of electronic components 120 or 125. In some examples, the thickness of support wall 151 can be approximately 0.1 mm to 5 mm.

In some examples, adhesive 160 can be interposed between first ledge 1511 and substrate top side 111. In some examples, adhesive 160 can be interposed between first riser 1512 and substrate lateral side 112. In some examples, adhesive 160 can extend between substrate lateral side 112 and a portion of second ledge 1513. In some examples, adhesive 160 need not reach second ledge 1513. In some examples, adhesive 160 can be thermally or electrically conductive or insulating between substrate 110 and support 150. In some examples, adhesive 160 can be referred to as an attachment material.

Support wall 151 can be coupled to substrate lateral side 112 as well as to substrate top side 111 of substrate 110. Accordingly, since support wall 151 is coupled to substrate 110 in a three-dimensional form, along at least two interfaces, the adhesion between support wall 151 and substrate 110 in a narrow foot width design can be improved without changing the footprint, the stiffness of support wall 151 itself can be improved, and package warpage phenomenon can also be reduced. The part of support wall 151 on the left side of FIG. 2C is an example where adhesive 160 is not confined within a region defined by first ledge 1511, top side 111 of substrate 110 overlapped by first ledge 1511, first riser 1512 and lateral side 112 of substrate 110 overlapped by first riser 1512. As illustrated in FIG. 2C, a portion of adhesive 160 extends below second ledge 1513. Similarly, the part of support wall 151 on the left side of FIG. 1 is an example where a portion of adhesive 160 extends below second ledge 1513 and extends beyond first ledge 1511. The part of support wall 151 on the rights of FIG. 1 is an example where adhesive 160 is confined within a region defined by first ledge 1511, top side 111 of substrate 110 overlapped by first ledge 1511, first riser 1512 and lateral side 112 of substrate 110 overlapped by first riser 1512.

In some examples, support 150 can further comprise support roof 155. In some examples, support roof 155 can be provided in the form of a substantially flat plate. Support roof 155 can extend from support wall 151 to cover electronic components 120 or 125, but in other examples support roof 155 can extend partially without covering a portion of electronic components 120, 125, or a portion of substrate 110.

In some examples, support roof 155 can be coupled to electronic component 120 or 125 through coupler film 190. In some examples, coupler film 190 can be thermally or electrically conductive or insulating. In some examples, coupler film 190 can comprise a thermal interface material (TIM), a die attach material, or an adhesive. Coupler film 190 can be similar to adhesive 160 in some implementations. In some examples, the thickness of support roof 155 can be approximately 0.1 mm to 5 mm.

Support roof 155 can provide further structural integrity to reduce package warpage phenomenon together with support wall 151. In some examples, since support roof 155 is coupled to electronic components 120 or 125, the heat of electronic components 120 or 125 can be rapidly discharged through support roof 155 or support wall 151.

In some examples support 150 can be manufactured integrally, with support wall 151 and support roof 155 as a single piece of material without adhesive 160, and can then be coupled to substrate top side 111 and substrate lateral side 112 of substrate 110 through adhesive 160.

In some examples, support wall 151 and support roof 155 can be manufactured separately and then coupled to each other. In some examples, support wall 151 can first be coupled to substrate top side 111 and substrate lateral side 112 of substrate 110 through adhesive 160, and then support roof 155 can be coupled to support wall 151 through adhesive 160. Support roof 155 can be simultaneously coupled to electronic component 120 or 125 through coupler film 190. In some examples, support roof 155 can be coupled to support wall 151 through adhesive 160, and then support wall 151 can be coupled to substrate top side 111 and substrate lateral side 112 of substrate 110 through adhesive 160. Support roof 155 can be simultaneously coupled to electronic component 120 or 125 through coupler film 190.

FIG. 2D shows a cross-sectional view of semiconductor device 10 at a later stage of manufacture. In the example shown in FIG. 2D, substrate interconnect 119 can be coupled with substrate 110. In some examples, substrate interconnects 119 can be optional. In some examples, substrate interconnects 119 can be provided at other stages of FIG. 2, such as at FIG. 2A along with substrate 110. Substrate interconnects 119 can comprise or be referred to as pads, lands, bumps, or solder balls. In some examples, substrate interconnects 119 can be positioned on bottom interconnect 1142 and can then be coupled to bottom interconnect 1142 by a mass reflow process or a laser assisted bonding process. In some examples, the thickness or diameter of substrate interconnects 119 can be between approximately 1 µm to approximately 2000 µm. Substrate interconnects 119 can couple semiconductor device 10 to an external device.

Figure 3A:
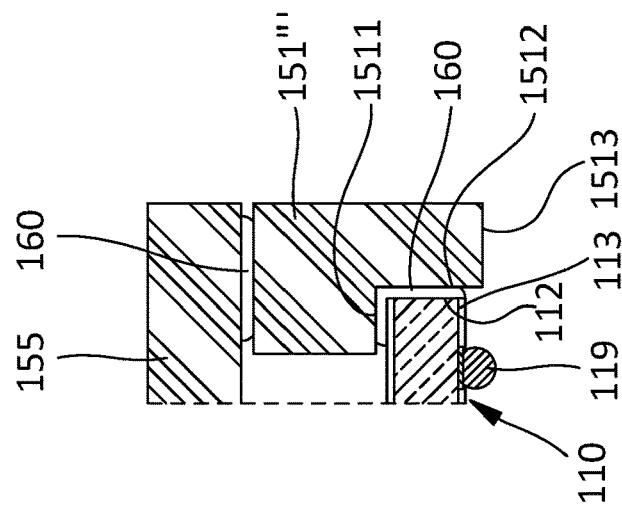
FIGS. 3A, 3B, and 3C shows partial cross-sectional views of an example semiconductor device.
Figure 3B:
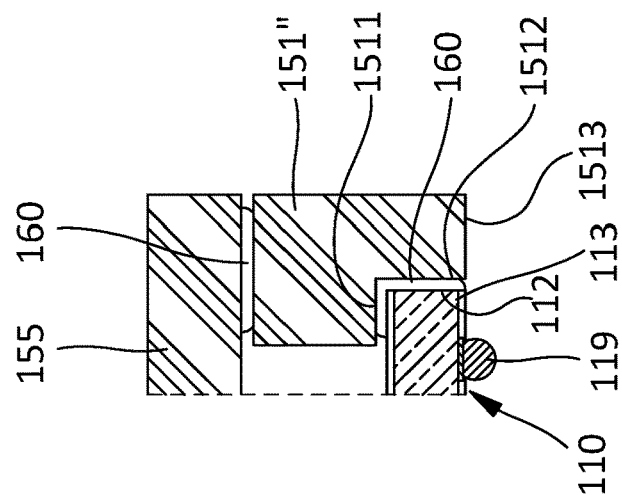
Figure 3C:
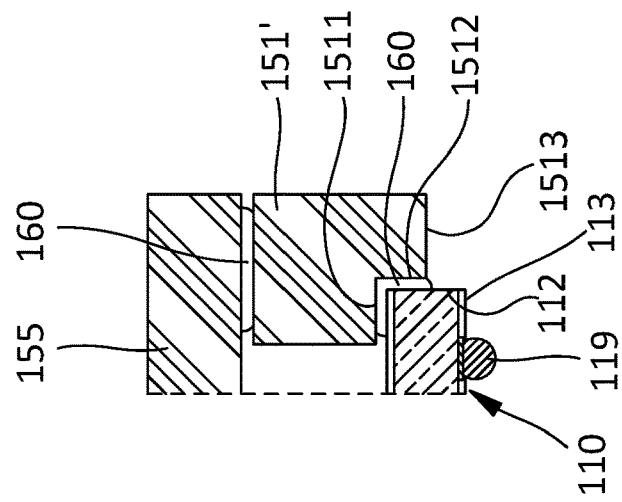

FIGS. 3A, 3B, and 3C show partial cross-sectional views of options for example semiconductor device 10. In the example shown in FIG. 3A, second ledge 1513 of support wall 151' can be positioned between substrate bottom side 113 and substrate top side 111 of substrate 110. Accordingly, a portion of substrate lateral side 112 of substrate 110 can be exposed. In the example shown in FIG. 3B, riser 1512 can extend further such that second ledge 1513 of support wall 151" can extend along a plane similar or same as that of substrate bottom side 113 of substrate 110. In some examples, second ledge 1513 is substantially coplanar with substrate bottom side 113 of substrate 110. In some examples, the further extension of riser 1512 can provide further structural integrity, or the adhesion area by adhesive 160 between substrate lateral side 112 and riser 1512 can increase. In the example shown in FIG. 3C, riser 1512 can extend further such that second ledge 1513 of support wall 151''' can be located below substrate bottom side 113 of substrate 110. In some examples, the further extension of riser 1512 can provide further structural integrity, or second ledge 1513 can then be coupled to an external component such as another substrate.

Figure 4A:
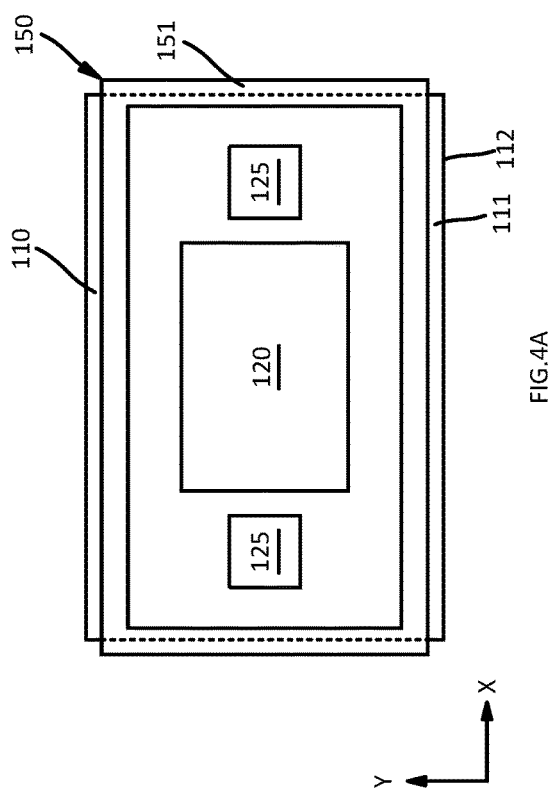
FIGS. 4A, 4B, and 4C shows top views of an example semiconductor device.
Figure 4B:
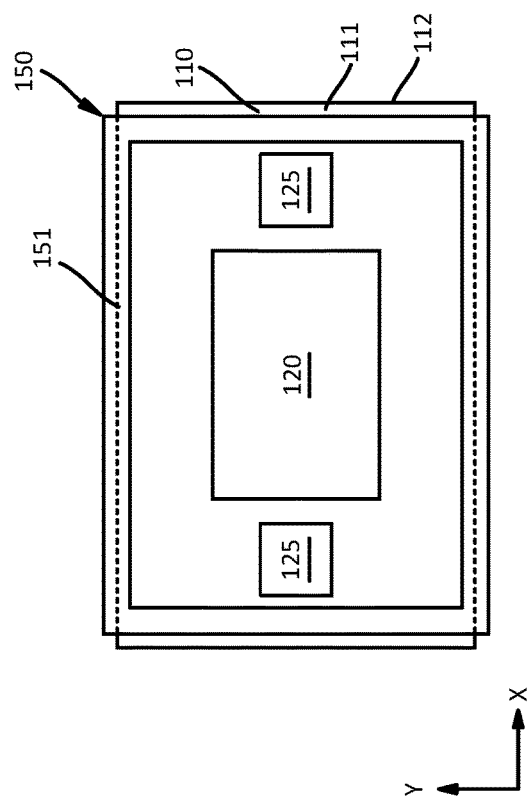
Figure 4C:
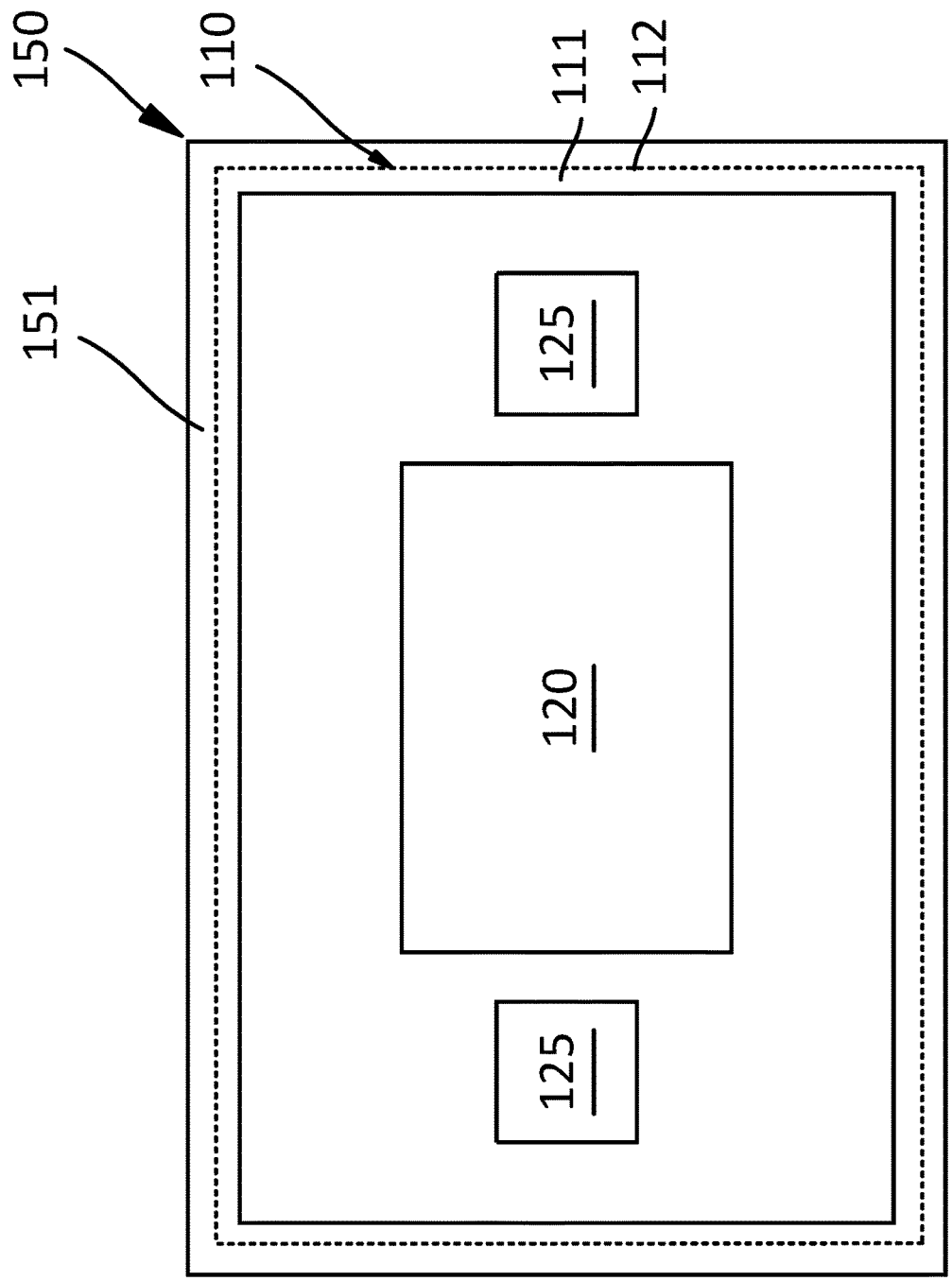

FIGS. 4A, 4B, and 4C show top views of options for example semiconductor device 10. In the example shown in FIGS. 4A to 4C, support wall 151 can be provided on the substrate 110 in a substantially rectangular ring shape.

In the example shown in FIG. 4A, for example, a pair of support walls 151 provided in the Y-axis direction can be coupled to substrate top side 111 and substrate lateral sides 112 of substrate 110, and a pair of support walls 151 provided in the X-axis direction can be coupled to substrate top side 111 of substrate 110 without overlapping substrate lateral sides 112. In the example shown in FIG. 4B, for example, a pair of support walls 151 provided in the X-axis direction can be coupled to substrate top side 111 and substrate lateral sides 112 of substrate 110, and a pair of support walls 151 provided in the Y-axis direction can be coupled to substrate top side 111 of substrate 110 without overlapping substrate lateral sides 112. In the example shown in FIG. 4C, the pair of support walls 151 provided in the X-axis direction can be coupled to substrate top side 111 and substrate lateral side 112 of substrate 110, and the pair of support walls 151 provided in the Y-axis direction can also be coupled to substrate top side 111 and substrate lateral side 112 of substrate 110. FIG. 4C is an example where support wall 151 surrounds electronic components 120 and 125 in a top view. FIGS. 4A, 4B, and 4C are examples where first ledge 1511 surrounds electronic components 120 and 125 in a top view. FIGS. 4A, 4B, and 4C are examples where first riser 1512 are disposed on at least two opposing sides of electronic components 120 and 125. FIG. 4C is an example where first riser 1512 is disposed on all sides of at least one of the electronic components 120 and 125.

The shape of support wall 151 (for example, whether support wall 151 and corresponding substrate lateral side 112 are coupled to each other) can be determined according to package warpage behavior. In some examples, if the package warpage mainly occurs along the Y-axis direction (or the package warpage mainly occurs along the X-axis direction), the shape of support wall 151 shown in FIG. 4A can be suitable. In some examples, if the package warpage mainly occurs along the X-axis direction (or the package warpage mainly occurs along the Y-axis direction), the shape of support wall 151 shown in 4B can be suitable. In some examples, if package warpages occur along both of the X-axis and Y-axis directions, the shape of support wall 151 shown in FIG. 4C can be suitable.

Figure 5:
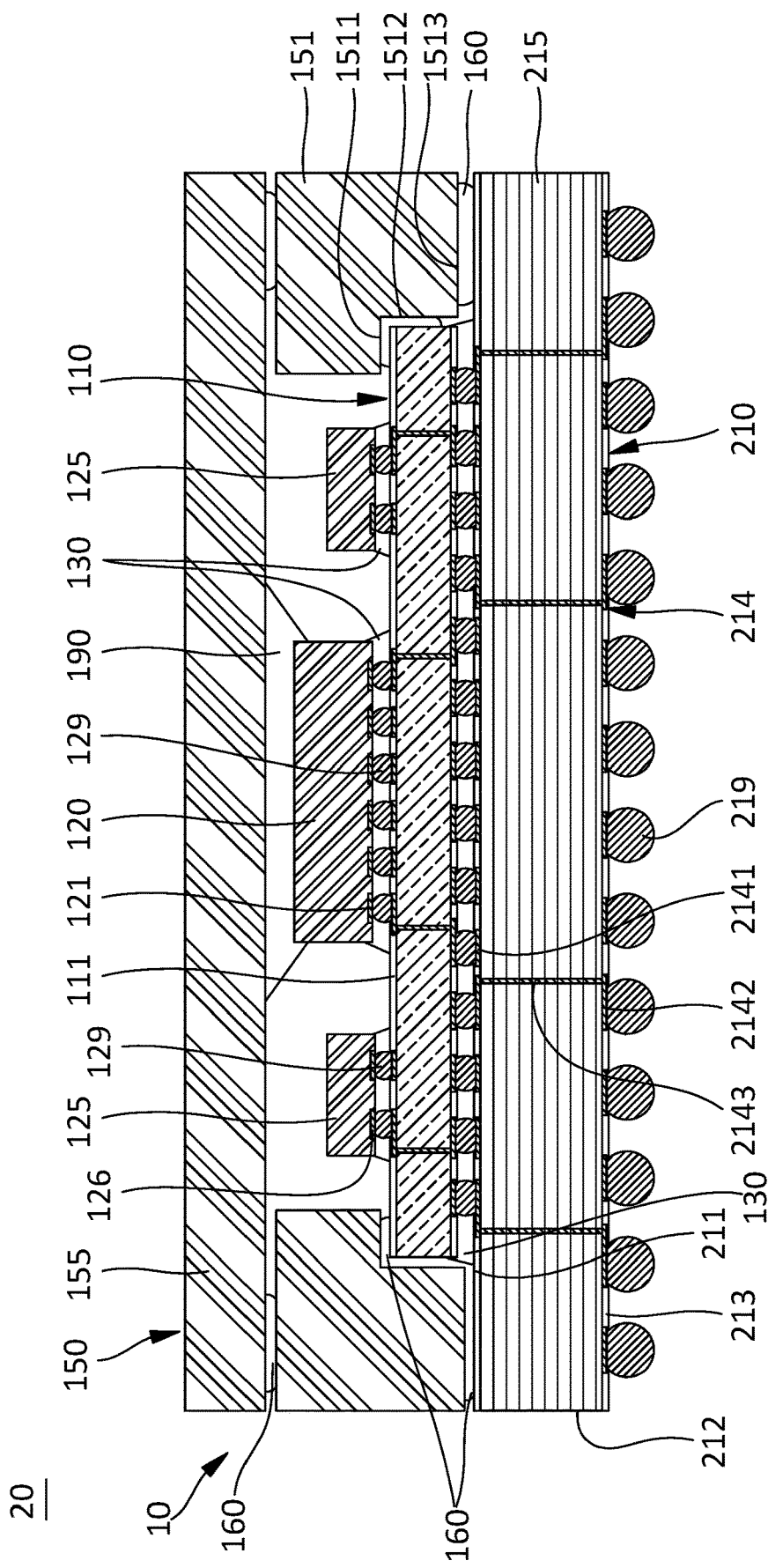
FIG. 5 shows a cross-sectional view of an example semiconductor device.

FIG. 5 shows a cross-sectional view of an example semiconductor device 20. Semiconductor device 20 shown in FIG. 5 can be similar to or can comprise semiconductor device 10 or variations described in FIGS. 1-4, and can also comprise base substrate 210.

In the example shown in FIG. 5, semiconductor device 20 comprises base substrate 210 and base interconnect 219. In some examples, the structure and materials of base substrate 210 can be similar to any of the options described with respect to substrate 110. Base substrate 210 can also comprise substantially flat top side 211, substantially flat bottom side 213 which is opposite to top side 211, and lateral sides 212 interposed between top side 211 and bottom side 213. Base substrate 210 can comprise conductive structure 214 and body structure 215.

The width/thickness/pitch of conductive structures 214 of base substrate 210 can be relatively larger than the width/thickness/pitch of conductive structures 114 of substrate 110. In some examples, body structure 215 of substrate 210 can comprise a preformed substrate such as a laminate substrate, and body structure 115 of substrate 110 can comprise a semiconductor substrate. In some examples, body structure 215 of substrate 210 can comprise a preformed substrate such as a laminate substrate, and body structure 115 of substrate 110 can comprise an RDL substrate.

Conductive structures 214 can comprise top interconnect 2141 provided on top side 211 of body structure 215, bottom interconnect 2142 provided on bottom side 213 of body structure 215, and conductive paths 2143 passing through body structure 215 to couple top interconnect 2141 and bottom interconnect 2142. Conductive paths 2143 can comprise one or more elements, such as pads, vias, or traces, coupled together. In some examples, the thickness of base substrate 210 can be about 0.1 mm to about 1000 mm. Base substrate 210 can support semiconductor device 20 and can couple the semiconductor device 20 to an external device.

In some examples, substrate underfill 130 can be further provided between substrate 110 and base substrate 210. Underfill 130 can enclose substrate interconnect 119 while securing substrate 110 and base substrate 210 to each other.

In some examples, second ledge 1513 of support wall 151 can be coupled to top side 211 of base substrate 210 through adhesive 160. In some examples, the thickness of first riser 1512 of support wall 151 can be similar to the thickness of substrate 110. First ledge 1511 and first riser 1512 of support wall 151 can be coupled to substrate top side 111 and substrate lateral side 112 of substrate 110 through adhesive 160, respectively, and second ledge 1513 of support wall 151 can be coupled to top side 211 of base substrate 210 through adhesive 160. In some examples, adhesive 160 can extend continuously or as separate portions coupling the different interfaces between the substrates 110,210 and support wall 151. With such configuration having support wall 151 coupled to both substrate 110 and base substrate 210, support 150 can restrict warpage of substrate 110 and warpage of base substrate 210.

Figure 6:
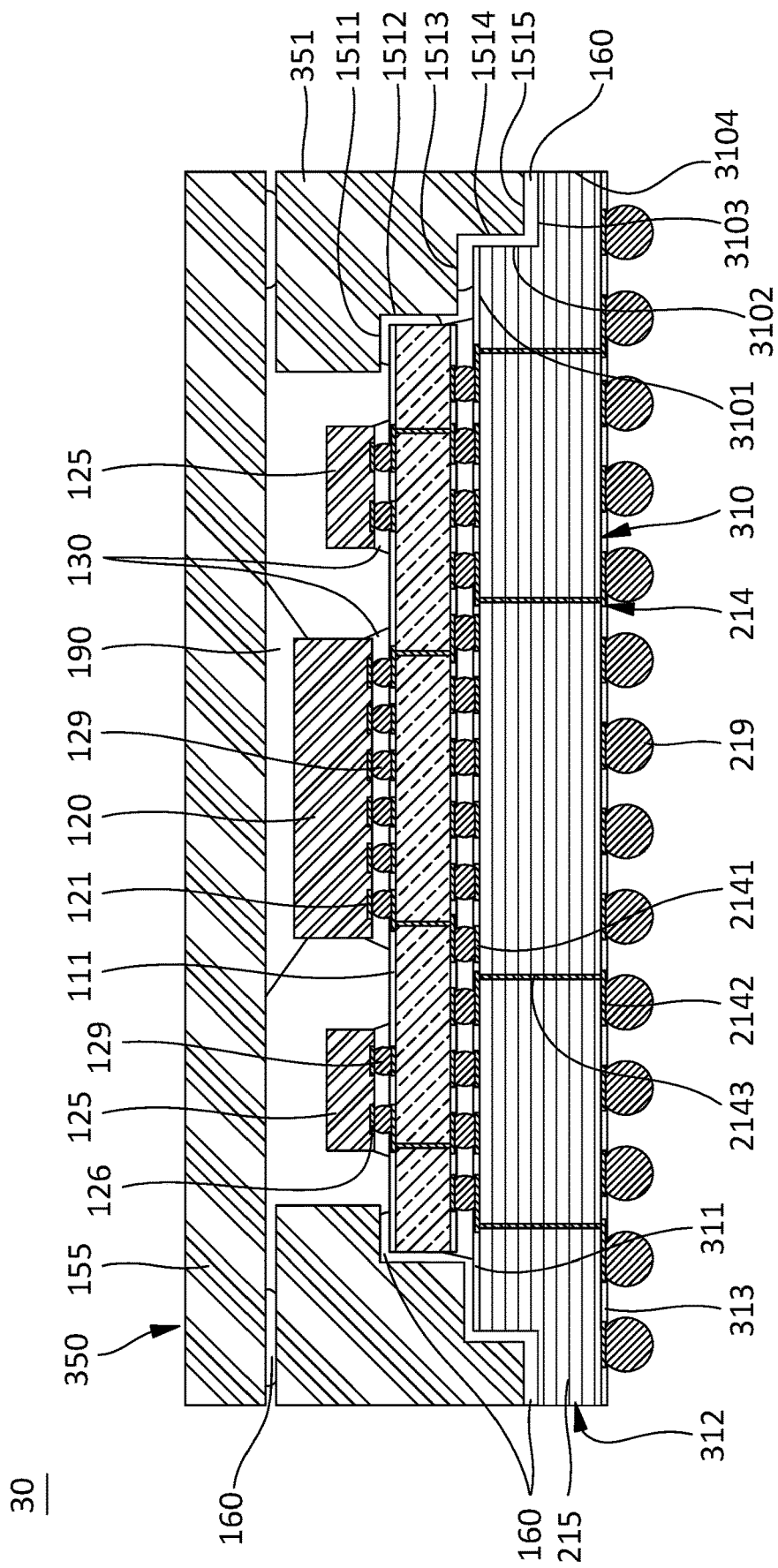
FIG. 6 shows a cross-sectional view of an example semiconductor device.

FIG. 6 shows a cross-sectional view of an example semiconductor device 30. Semiconductor device 30 shown in FIG. 6 can be similar to semiconductor device 20 shown in FIG. 5 and can comprise base substrate 310 coupled to support wall 351 of support 350.

In the example shown in FIG. 6, base substrate 310 can be similar to base substrate 210. Base substrate 310 can comprise substrate top side 311, substrate bottom side 313 which is opposite to substrate top side 311, and substrate lateral side 312 between substrate top side 311 and substrate bottom side 313. In some examples, a portion of substrate top side 311 can comprise substrate first ledge 3101, and substrate lateral side 312 can comprise substrate first riser 3102, substrate second ledge 3103, and substrate second riser 3104 between substrate top side 311 and substrate bottom side 313.

Substrate first riser 3102 and substrate second riser 3104 can be substantially orthogonal to substrate top side 311. Substrate first ledge 3101 and substrate second ledge 3103 can be substantially parallel to substrate top side 311. In some examples, substrate first riser 3102 and substrate second ledge 3103 of base substrate 310 can be provided by a mechanical partial cutting process, a chemical partial etching process, or a laser ablation process.

Support wall 351 of support 350 can be similar to support wall 151 of support 150. Support wall 351 can comprise second ledge 1513, second riser 1514 and third ledge 1515 respectively interfaced adjacent to corresponding substrate first ledge 3101, substrate first riser 3102 and substrate second ledge 3103 of base substrate 310. In some examples, second ledge 1513 of support wall 351 can be coupled to substrate first ledge 3101 of base substrate 310 through adhesive 160. In some examples, second riser 1514 of support wall 351 can be coupled to substrate first riser 3102 of base substrate 310 through adhesive 160. In some examples, third ledge 1515 of support wall 351 can be coupled to substrate second ledge 3103 of base substrate 310 through adhesive 160. In some examples, adhesive 160 can extend continuously or as separate portions coupling the different interfaces between the substrates 110, 310 and support wall 351.

As described above, second ledge 1513, second riser 1514, and third ledge 1515 of the support wall 151 can be respectively coupled to substrate first ledge 3101, substrate first riser 3102 and substrate second ledge 3103 of base substrate 310 through adhesive 160, such that support wall 351 of support 350 can be further coupled to base substrate 310 in a three-dimensional form where the adhesion between each of support wall 351 and substrate 110 and base substrate 310 in a narrow foot width design can be improved without changing the footprint, and the stiffness of support wall 351 itself can be improved, and the package warpage phenomenon can be further reduced.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:
1. A semiconductor device, comprising:
   a first substrate comprising:
      a first substrate top side;
      a first substrate bottom side opposite to the first substrate top side;
      a first substrate lateral side interposed between the first substrate top side and the first substrate bottom side; and
      a first substrate conductive structure;

an electronic component coupled to the first substrate top side and coupled to the first substrate conductive structure;
a second substrate comprising:
a second substrate top side;
a second substrate bottom side opposite to the second substrate top side;
a second substrate lateral side interposed between the second substrate top side and the second substrate bottom side;
a second substrate first riser extending into the second substrate from the second substrate top side; and
a second substrate ledge extending laterally outward from the second substrate first riser to the second substrate lateral side, wherein the first substrate bottom side is coupled to the second substrate top side; and
a support comprising:
a support wall comprising:
a support wall top side;
a support wall bottom side;
a support wall outer lateral side coupling the support wall top side to the support wall bottom side;
a first ledge directly attached to the first substrate top side with a first adhesive, wherein the first adhesive contacts both the first ledge and the first substrate top side;
a first riser directly attached to the first substrate lateral side with the first adhesive, wherein the first adhesive contacts both the first riser and the first substrate lateral side;
a second ledge laterally extending from the first riser away from the first substrate lateral side and directly attached to the second substrate top side with the first adhesive, wherein the first adhesive contacts both the second ledge and the second substrate top side;
a second riser extending downward from the second ledge and directly attached to the second substrate first riser with the first adhesive, wherein the first adhesive contacts both the second riser and the second substrate first riser; and
a third ledge extending outward from the second riser to the second substrate lateral side and directly attached to the second substrate ledge with the first adhesive, wherein the first adhesive contacts both the third ledge and the second substrate ledge;
wherein:
the first substrate comprises a first pair of opposing lateral sides and a second pair of opposing lateral sides;
the support wall comprises a first portion and second portion;
the first portion and the second portion are along the first pair of opposing lateral sides; and
the second pair of opposing lateral sides is devoid of the support wall.

2. The semiconductor device of claim 1, wherein:
the support wall comprises:
a first width at the support wall top side; and
a second width at the support wall bottom side adjacent to the third ledge; and
the second width is less than the first width.

3. The semiconductor device of claim 1, wherein:
the support wall outer lateral side and the second substrate lateral side are substantially coplanar.

4. The semiconductor device of claim 1, wherein:
the second ledge is positioned below the first substrate bottom side.

5. The semiconductor device of claim 1, wherein:
the support further comprises:
a support roof attached to the support wall top side and extending to overlap the electronic component; and
the support roof comprises an outer edge coplanar with the support wall outer lateral side.

6. The semiconductor device of claim 5, wherein:
the support roof is attached to the support wall top side with an attachment material.

7. The semiconductor device of claim 5, further comprising:
a coupler film interposed between the electronic component and the support roof.

8. The semiconductor device of claim 7, wherein:
the coupler film comprises a thermally conductive material.

9. The semiconductor device of claim 1, wherein:
the first substrate comprises opposing corner edges connected by the first substrate lateral side; and
the support wall outer lateral side extends continuously along the first substrate lateral side between the opposing corner edges without a break.

10. The semiconductor device of claim 1, wherein:
the first adhesive is a continuous structure extending from the first ledge to the third ledge.

11. The semiconductor device of claim 1, further comprising:
a second electronic component coupled to the first substrate top side;
wherein:
the support further comprises a support roof coupled to the support wall top side and extending to overlap the electronic component and the second electronic component; and
a coupler film interposed between the electronic component and the support roof but not between the second electronic component and the support roof.

12. A semiconductor device comprising:
a first substrate comprising:
a first substrate top side;
a first substrate bottom side opposite to the first substrate top side;
a first substrate lateral side interposed between the first substrate top side and the first substrate bottom side, wherein the first substrate lateral side comprises a height between the first substrate top side and the first substrate bottom side and a length perpendicular to the height;
a first corner edge;
a second corner edge opposite to the first corner edge, wherein the length extends between the first corner edge and the second corner edge, and wherein the first substrate lateral side has a central portion between the first corner edge and the second corner edge; and
a first substrate conductive structure;
an electronic component coupled to the first substrate conductive structure adjacent to the first substrate top side; and
a support comprising:
a support wall comprising:

a first ledge directly attached to the first substrate top side with a first adhesive, wherein the first adhesive contacts both the first ledge and the first substrate top side;
a first riser attached to the first substrate lateral side along the length including the central portion of the first substrate lateral side, wherein the first riser is directly attached to the first substrate lateral side with the first adhesive, and wherein the first adhesive contacts both the first riser and the first substrate lateral side, and wherein the first adhesive is a continuous layer extending between the first ledge and the first riser; and
a second ledge extending from the first riser away from the first substrate lateral side; and
a support roof attached to the support wall with a second adhesive and overlapping the electronic component;
wherein:
the first substrate comprises a first pair of opposing lateral sides and a second pair of opposing lateral sides;
the support wall comprises a first portion and second portion;
the first portion and the second portion are along the first pair of opposing lateral sides; and
the second pair of opposing lateral sides is devoid of the support wall.

13. The semiconductor device of claim 12, further comprising:
a second substrate coupled to the first substrate and comprising:
a second substrate top side;
a second substrate bottom side opposite to the second substrate top side;
a second substrate lateral side interposed between the second substrate top side and the second substrate bottom side;
a second substrate first riser extending into the second substrate from the second substrate top side; and
a second substrate ledge extending laterally outward from the second substrate first riser to the second substrate lateral side; and
a coupler film interposed between the electronic component and the support roof;
wherein:
the first riser is directly attached to the first substrate lateral side along the length in its entirety with the first adhesive, wherein the first adhesive contacts both the first riser and the first substrate lateral side;
the second ledge is directly attached to the second substrate top side with the first adhesive, wherein the first adhesive contacts both the second ledge and the second substrate top side;
the first adhesive is a continuous layer extending between the first ledge and the second ledge;
the second substrate comprises a second conductive structure;
the support wall comprises an outer lateral side;
the outer lateral side is substantially coplanar with the second substrate lateral side; and
the support wall is electrically isolated from the second conductive structure.

14. A method of manufacturing a semiconductor device, comprising:
providing a first substrate comprising:
a first substrate top side;
a first substrate bottom side opposite to the first substrate top side;
a first substrate lateral side interposed between the first substrate top side and the first substrate bottom side, wherein the first substrate lateral side comprises a height between the first substrate top side and the first substrate bottom side and a length perpendicular to the height;
a first corner edge;
a second corner edge opposite to the first corner edge, wherein the length extends between the first corner edge and the second corner edge, and wherein the first substrate lateral side has a central portion between the first corner edge and the second corner edge; and
a first substrate conductive structure;
coupling an electronic component to the first substrate conductive structure at the first substrate top side;
providing a support comprising:
a support wall comprising:
a first ledge;
a first riser; and
a second ledge; and
a support roof; and
attaching the support to substrate so that:
the first ledge is directly attached to the first substrate top side with a first adhesive, wherein the first adhesive contacts both the first ledge and the first substrate top side;
the first riser is directly attached to the first substrate lateral side along the length including the central portion of the first substrate lateral side, wherein the first riser is attached to the first substrate lateral side with the first adhesive, wherein the first adhesive contacts both the first riser and the first substrate lateral side, and wherein the first adhesive is a continuous layer extending between the first ledge and the first riser;
the second ledge extends extending from the first riser away from the first substrate lateral side; and
the support roof is attached to the support wall with a second adhesive and overlapping the electronic component;
wherein:
the first substrate comprises a first pair of opposing lateral sides and a second pair of opposing lateral sides;
the support wall comprises a first portion and second portion;
the first portion and the second portion are along the first pair of opposing lateral sides; and
the second pair of opposing lateral sides is devoid of the support wall.

15. The method of claim 14, further comprising:
providing a second substrate coupled to the first substrate and comprising:
a second substrate top side;
a second substrate bottom side opposite to the second substrate top side;
a second substrate lateral side interposed between the second substrate top side and the second substrate bottom side;
a second substrate first riser extending into the second substrate from the second substrate top side; and
a second substrate ledge extending laterally outward from the second substrate first riser to the second substrate lateral side; and providing a coupler film interposed between the electronic component and the support roof; wherein:
- the first riser directly attached to the first substrate lateral side along the length in its entirety with the first adhesive, wherein the first adhesive contacts both the first riser and the first substrate lateral side;
- the second ledge is directly attached to the second substrate top side with the first adhesive, wherein the first adhesive contacts both the second ledge and the second substrate top side;
- the first adhesive is a continuous layer extending between the first ledge and the second ledge;
- the second substrate comprises a second conductive structure;
- the support wall comprises an outer lateral side;
- the outer lateral side is substantially coplanar with the second substrate lateral side; and
- the support wall is electrically isolated from the second conductive structure.

16. The method of claim 14, wherein:
attaching the support comprises positioning the second ledge so that the second ledge is substantially coplanar with the first substrate bottom side.

17. The method of claim 14, wherein:
attaching the support comprises positioning the second ledge below the first substrate bottom side.

* * * * *